US012581889B2

(12) United States Patent
Niitsu et al.

(10) Patent No.: US 12,581,889 B2
(45) Date of Patent: Mar. 17, 2026

(54) DIVIDING METHOD OF WAFER

(71) Applicant: DISCO CORPORATION, Tokyo (JP)

(72) Inventors: Keiichiro Niitsu, Tokyo (JP);
Youngsuk Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 476 days.

(21) Appl. No.: 18/451,923

(22) Filed: Aug. 18, 2023

(65) Prior Publication Data

US 2024/0071827 A1 Feb. 29, 2024

(30) Foreign Application Priority Data

Aug. 26, 2022 (JP) ................................. 2022-134988

(51) Int. Cl.
| | |
|---|---|
| *H01L 21/78* | (2006.01) |
| *B23K 26/354* | (2014.01) |
| *B23K 26/364* | (2014.01) |
| *H01L 21/268* | (2006.01) |
| *H01L 21/304* | (2006.01) |
| *H01L 23/544* | (2006.01) |
| *B23K 101/40* | (2006.01) |

(52) U.S. Cl.
CPC ............ *H01L 21/78* (2013.01); *B23K 26/354* (2015.10); *B23K 26/364* (2015.10); *H01L 21/268* (2013.01); *H01L 21/304* (2013.01);

*H01L 23/544* (2013.01); *B23K 2101/40* (2018.08); *H01L 2223/5446* (2013.01)

(58) Field of Classification Search
None
See application file for complete search history.

(56) References Cited

U.S. PATENT DOCUMENTS

2017/0213774 A1* 7/2017 Lu ......................... B23K 26/364
2018/0161919 A1* 6/2018 Yamada ............... B23K 26/359
2019/0096676 A1* 3/2019 Zhao ..................... H01L 21/268

FOREIGN PATENT DOCUMENTS

JP 2010177430 A 8/2010

* cited by examiner

*Primary Examiner* — Hung K Vu
(74) *Attorney, Agent, or Firm* — Greer Burns & Crain Ltd.

(57) ABSTRACT

In a dividing method of a wafer, first edge parts and second edge parts that are the edges of chips are melted by executing irradiation with a laser beam. Therefore, the edges of the chips can be planarize. In addition, cracks, chipping, and so forth caused in the edges of the chips can be coupled. Therefore, it becomes possible to repair at least part of processing strain of the edges of the chips. As a result, a flexural strength of the chips can be enhanced.

7 Claims, 12 Drawing Sheets

FIG.14

| WAVELENGTH | PROCESSING RESULT |
|---|---|
| 266nm | DEFECTIVE |
| 355nm | DEFECTIVE<br>LASER BEAM WAS READILY ABSORBED AT WAFER SURFACE, AND DEPTH OF MELTING WAS SHALLOW AND DEPTH WAS INSUFFICIENT TO REPAIR PROCESSING STRAIN. |
| 500nm | FAVORABLE |
| 532nm | FAVORABLE |
| 800nm | FAVORABLE |
| 1000nm | FAVORABLE |
| 1064nm | DEFECTIVE<br>LASER BEAM WAS TRANSMITTED THROUGH WAFER, AND INTERNAL PROCESSING WAS CAUSED WITHOUT MELTING AND CRACKS WERE FORMED WITH PART EXPANDED DUE TO INTERNAL PROCESSING BEING POINT OF ORIGIN. |

DIVIDING METHOD OF WAFER

BACKGROUND OF THE INVENTION

Field of the Invention

The present invention relates to a dividing method of a wafer.

Description of the Related Art

There is a dividing method of a wafer by which the wafer on which a plurality of devices are formed on a front surface is divided into a plurality of chips along a plurality of planned dividing lines that intersect (for example, refer to Japanese Patent Laid-open No. 2010-177430).

SUMMARY OF THE INVENTION

A flexural strength of chips lowers if processing strain (including damage such as chipping, crack, lowering of the strength, embrittlement, and alteration) remains in the chips in dividing of a wafer.

Thus, an object of the present invention is to provide a dividing method of a wafer in which processing strain that remains in chips is removed.

In accordance with a first aspect of the present invention, there is provided a dividing method of a wafer by which the wafer having device regions marked out by a plurality of planned dividing lines that intersect in a front surface is divided along the planned dividing lines. The dividing method of a wafer includes a back surface grinding step of grinding a back surface of the wafer, a dividing step of dividing the wafer from the front surface along the planned dividing lines to form a plurality of chips, and a first energy supply step of supplying energy to at least any part of edges, back surfaces, and side surfaces of the chips from the back surface of the wafer and melting the at least any part to repair at least part of processing strain.

In accordance with a second aspect of the present invention, there is provided a dividing method of a wafer by which the wafer having device regions marked out by a plurality of planned dividing lines that intersect in a front surface is divided along the planned dividing lines. The dividing method of a wafer includes a processing groove forming step of forming processing grooves deeper than a finished thickness in the wafer from the front surface, a back surface grinding step of grinding the wafer to the finished thickness from a back surface of the wafer to divide the wafer and form a plurality of chips after execution of the processing groove forming step, and a first energy supply step of supplying energy to at least any part of edges, back surfaces, and side surfaces of the chips from the back surface of the wafer and melting the at least any part to repair at least part of processing strain.

Preferably, the first energy supply step includes a side surface exposure step of pushing up chips of a supply target of the energy relatively compared with other chips and exposing side surfaces of the chips of the supply target of the energy, and the energy is supplied to the side surfaces exposed in the side surface exposure step.

Preferably, the first energy supply step is a step of executing irradiation with a laser beam. Preferably, a wavelength of the laser beam is a wavelength having absorbability with respect to the wafer. Preferably, a wavelength of the laser beam is a wavelength in a range of 500 to 1000 nm.

Preferably, the dividing method of a wafer further includes a second energy supply step of supplying energy to at least any part of the edges, the back surfaces, and the side surfaces of the chips from the front surface of the wafer and melting the at least any part.

According to the present invention, the first energy supply step is executed and the energy is supplied to at least any part of the edges, the back surfaces, and the side surfaces of the chips from the back surface of the wafer to melt and recrystallize this part (laser-irradiated part). This can planarize the laser-irradiated part and couple cracks, chipping, and so forth at this part. Therefore, at least part of processing strain of the laser-irradiated part can be repaired. As a result, the flexural strength of the chips can be enhanced.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 14 is a diagram illustrating a table indicating a relation between a wavelength of a laser beam emitted from a laser oscillator and a result of a melting step executed by using the respective laser beams.

DETAILED DESCRIPTION OF THE PREFERRED EMBODIMENTS

First Embodiment

Figure 1A:
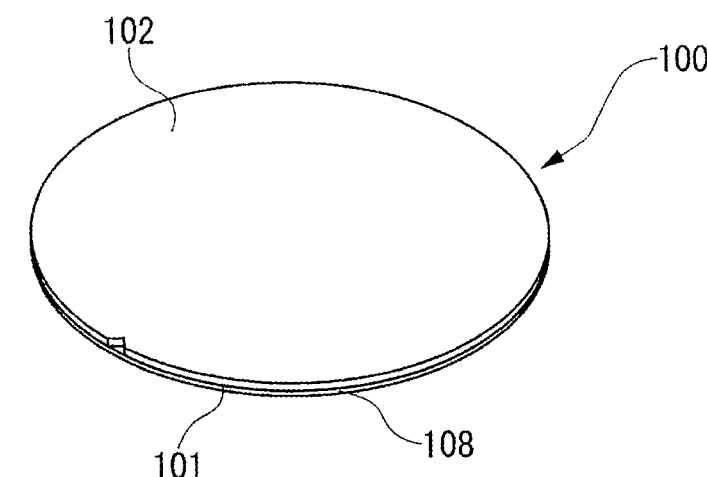
FIG. 1A is a perspective view illustrating a wafer.
Figure 1B:
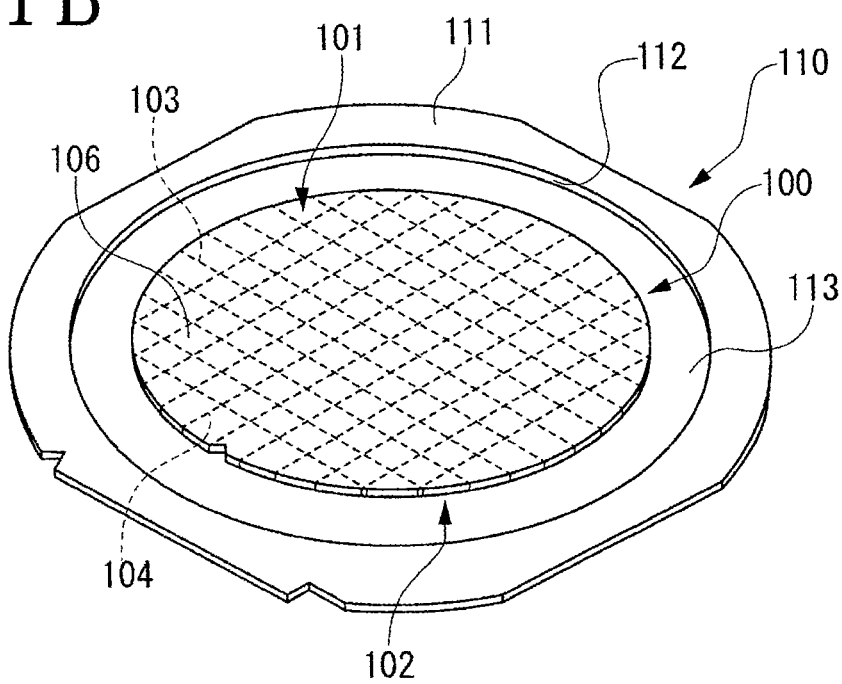
FIG. 1B is a perspective view illustrating a frame unit including the wafer.

In the present embodiment, a wafer 100 like one illustrated in FIG. 1A and FIG. 1B is used as a workpiece. The wafer 100 is formed into a circular shape and has a front surface 101 and a back surface 102. Furthermore, as illustrated in FIG. 1B, a plurality of first planned dividing lines 103 extending in a first direction and a plurality of second planned dividing lines 104 extending in a second direction orthogonal to the first direction are formed in the front surface 101 of the wafer 100. Regions marked out by the first planned dividing lines 103 and second planned dividing lines 104 are device regions 106. Devices that are not illustrated may be formed in the device regions 106.

In the present embodiment, the wafer 100 is treated in a state in which a protective tape 108 is stuck to the front surface 101 as illustrated in FIG. 1A or in a state of a frame unit 110 as illustrated in FIG. 1B.

The frame unit 110 is formed by integrating an annular frame 111 having an opening 112 in which the wafer 100 can be housed and the wafer 100 positioned in the opening 112 of the annular frame 111 by a dicing tape 113.

Figure 2:
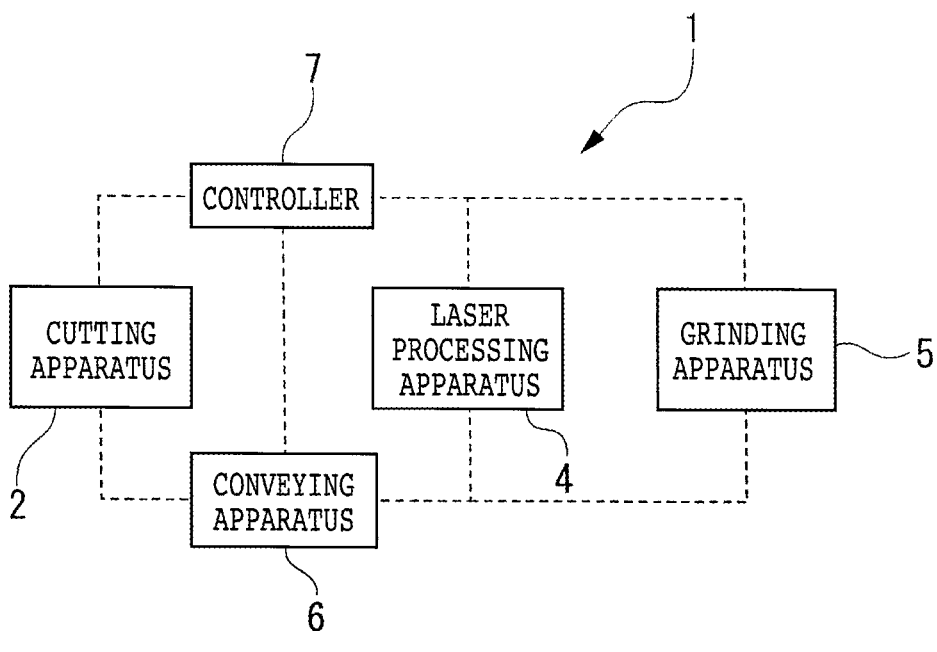
FIG. 2 is a block diagram illustrating a configuration of a processing system.

In the present embodiment, the wafer 100 is processed in a processing system 1 illustrated in FIG. 2. The processing system 1 is a system that processes the wafer 100 and includes a cutting apparatus 2 that executes cutting processing of the wafer 100, a laser processing apparatus 4 that executes laser processing of the wafer 100, a grinding apparatus 5 that executes grinding processing of the wafer 100, a conveying apparatus 6 that conveys the wafer 100 among them, and a controller 7 that controls these pieces of apparatus.

Figure 3:
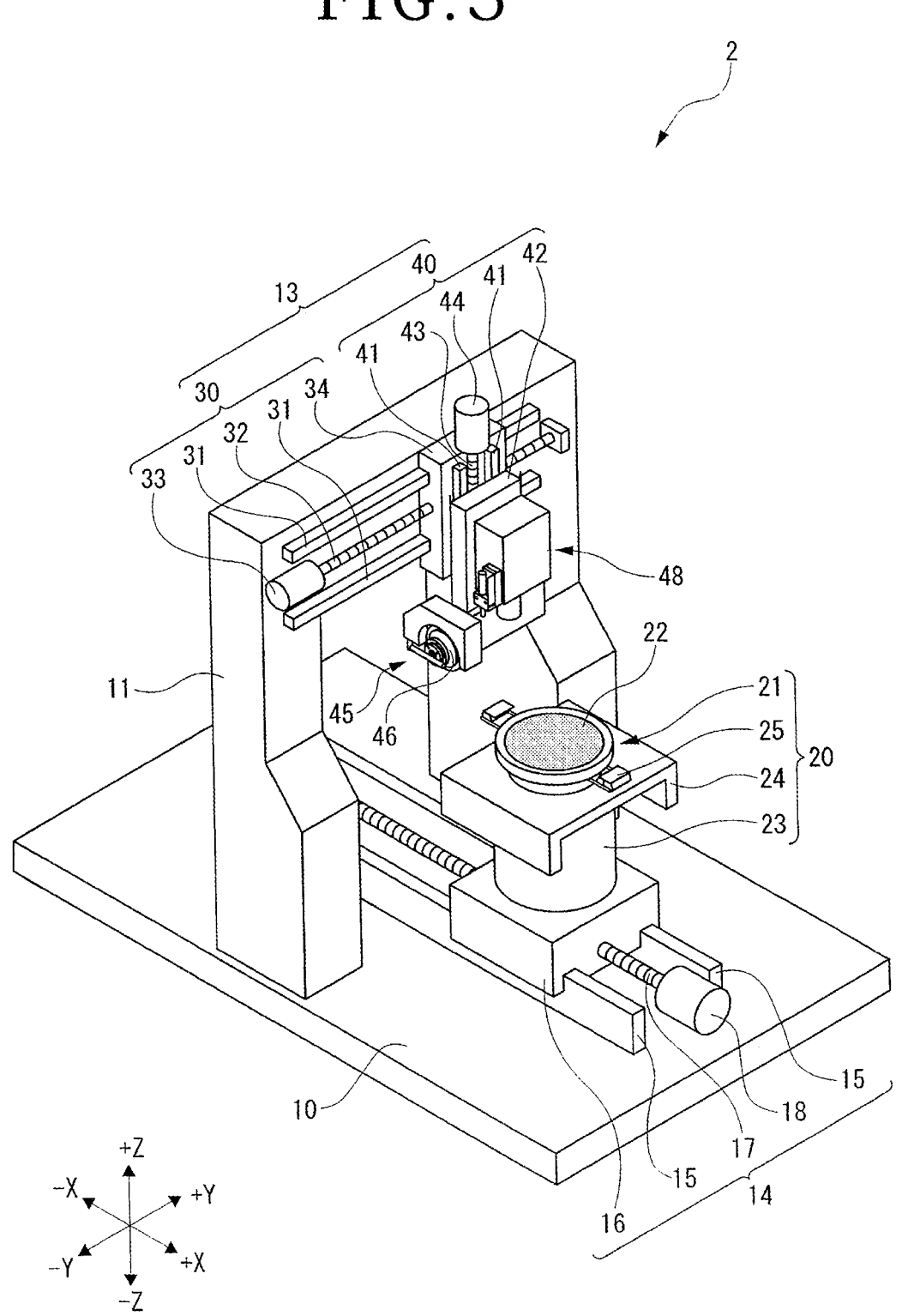
FIG. 3 is a perspective view illustrating a configuration of a cutting apparatus.

First, the configuration of the cutting apparatus 2 will be described. For example, the cutting apparatus 2 executes the cutting processing of the wafer 100 included in the frame unit 110 like that illustrated in FIG. 1B. As illustrated in FIG. 3, the cutting apparatus 2 includes a base 10 and a processing feed mechanism 14 is disposed on the base 10. The processing feed mechanism 14 moves a holding part 20 including a holding table 21 along a processing feed direction (X-axis direction) parallel to a holding surface 22 of the holding table 21 relative to a cutting blade 46 of a cutting mechanism 45.

The processing feed mechanism 14 includes a pair of guide rails 15 extending in the X-axis direction, an X-axis table 16 placed on the guide rails 15, a ball screw 17 extending in parallel to the guide rails 15, and a motor 18 that rotates the ball screw 17.

The pair of guide rails 15 are disposed on an upper surface of the base 10 in parallel to the X-axis direction. The X-axis table 16 is set on the pair of guide rails 15 slidably along the guide rails 15. The holding part 20 is placed on the X-axis table 16.

The ball screw 17 is screwed to a nut part (not illustrated) disposed on the X-axis table 16. The motor 18 is coupled to one end part of the ball screw 17 and rotationally drives the ball screw 17. Through rotational driving of the ball screw 17, the X-axis table 16 and the holding part 20 move along the X-axis direction, which is the processing feed direction, along the guide rails 15.

The holding part 20 includes the holding table 21 that holds the wafer 100 (see FIGS. 1A and 1B) of the frame unit 110, a cover plate 24 disposed around the holding table 21, and two clamp parts 25 disposed around the holding table 21. Furthermore, the holding part 20 has a θ table 23 that supports the holding table 21 and rotates it in an XY-plane under the cover plate 24.

The holding table 21 is a component that holds the wafer 100 illustrated in FIGS. 1A and 1B and is formed into a circular shape. The holding table 21 includes the holding surface 22 composed of a porous material. The holding surface 22 can communicate with a suction source that is not illustrated. The holding table 21 sucks and holds the wafer 100 in the frame unit 110 by the holding surface 22.

The two clamp parts 25 disposed around the holding table 21 clamp and fix the annular frame 111 around the wafer 100 held by the holding table 21.

A gate-shaped column 11 is erected to straddle the processing feed mechanism 14 on a rear side (−X direction side) on the base 10. A cutting mechanism movement mechanism 13 that moves the cutting mechanism 45 is disposed on the front surface (surface on the +X direction side) of the gate-shaped column 11.

The cutting mechanism movement mechanism 13 executes indexing feed of the cutting mechanism 45 in a Y-axis direction and executes cutting-in feed of the cutting mechanism 45 in a Z-axis direction. The cutting mechanism movement mechanism 13 includes an indexing feed mechanism 30 that moves the cutting mechanism 45 in an indexing feed direction (Y-axis direction) and a cutting-in feed mechanism 40 that moves the cutting mechanism 45 in a cutting-in feed direction (Z-axis direction).

The indexing feed mechanism 30 is disposed on the front surface of the gate-shaped column 11. The indexing feed mechanism 30 adjusts a position of the cutting mechanism 45 in the Y-axis direction by causing reciprocating movement of the cutting-in feed mechanism 40 and the cutting mechanism 45 along the Y-axis direction.

The indexing feed mechanism 30 includes a pair of guide rails 31 extending in the Y-axis direction, a Y-axis table 34 placed on the guide rails 31, a ball screw 32 extending in parallel to the guide rails 31, and a motor 33 that rotates the ball screw 32.

The pair of guide rails 31 are disposed on the front surface of the gate-shaped column 11 in parallel to the Y-axis direction. The Y-axis table 34 is set on the pair of guide rails 31 slidably along the guide rails 31. The cutting-in feed mechanism 40 and the cutting mechanism 45 are attached onto the Y-axis table 34.

The ball screw 32 is screwed to a nut part (not illustrated) disposed on the Y-axis table 34. The motor 33 is coupled to one end part of the ball screw 32 and rotationally drives the ball screw 32. Through rotational driving of the ball screw 32, the Y-axis table 34, the cutting-in feed mechanism 40, and the cutting mechanism 45 move in the Y-axis direction which is the indexing feed direction, along the guide rails 31.

The cutting-in feed mechanism 40 causes reciprocating movement of the cutting mechanism 45 along the Z-axis direction (upward-downward direction). The Z-axis direction is the direction that is orthogonal to the X-axis direction and the Y-axis direction and is orthogonal to the holding surface 22 of the holding table 21.

The cutting-in feed mechanism 40 includes a pair of guide rails 41 extending in the Z-axis direction, a support component 42 placed on the guide rails 41, a ball screw 43 extending in parallel to the guide rails 41, and a motor 44 that rotates the ball screw 43.

The pair of guide rails 41 are disposed on the Y-axis table 34 in parallel to the Z-axis direction. The support component 42 has an imaging mechanism 48 and is set on the pair of guide rails 41 slidably along the guide rails 41. The cutting mechanism 45 is attached to a lower end part of the support component 42.

The ball screw 43 is screwed to a nut part (not illustrated) disposed on the back surface side of the support component 42. The motor 44 is coupled to one end part of the ball screw 43 and rotationally drives the ball screw 43. Through rotational driving of the ball screw 43, the support component 42 and the cutting mechanism 45 move in the Z-axis direction which is the cutting-in feed direction, along the guide rails 41.

The cutting mechanism 45 is what cuts the wafer 100 held by the holding table 21, and rotatably supports the cutting blade 46 that cuts the wafer 100.

The cutting mechanism 45 includes a spindle on which the cutting blade 46 is mounted and that rotates, a housing that supports the spindle rotatably, a motor that rotationally drives the spindle, and so forth in addition to the cutting blade 46. In the cutting mechanism 45, the cutting processing for the wafer 100 is executed by the cutting blade 46 that rotates at high speed together with the spindle by the motor.

Figure 4:
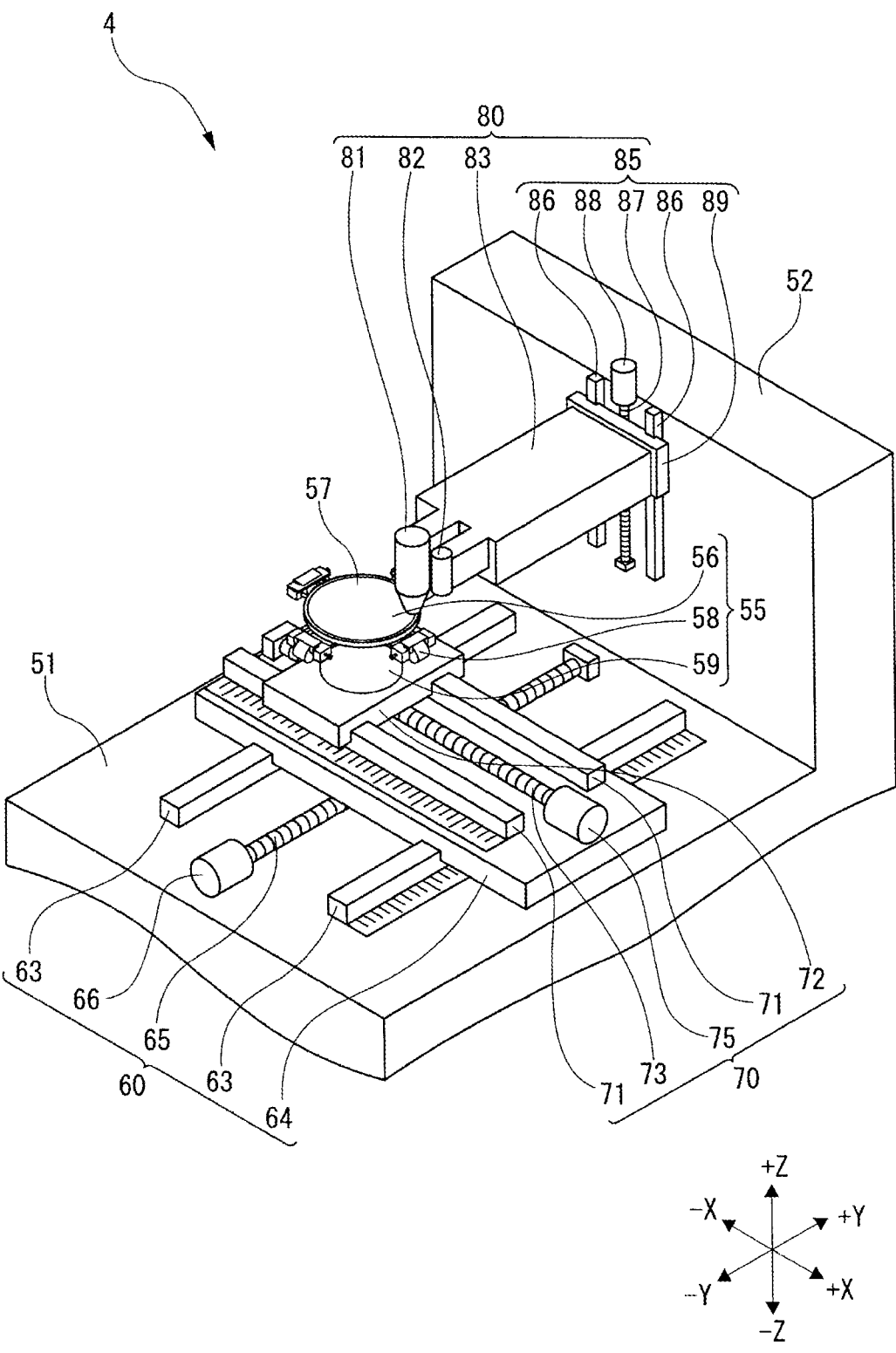
FIG. 4 is a perspective view illustrating a configuration of a laser processing apparatus.

Next, the configuration of the laser processing apparatus 4 in the processing system 1 illustrated in FIG. 2 will be described. The laser processing apparatus 4 executes the cutting processing of the wafer 100 included in the frame unit 110 like that illustrated in FIG. 1B, for example, similarly to the cutting apparatus 2. As illustrated in FIG. 4, the laser processing apparatus 4 includes a base 51 with a rectangular parallelepiped shape and an erected wall part 52 erected at one end of the base 51.

The laser processing apparatus 4 includes, over the upper surface of the base 51, a holding part 55 including a holding table 56, a Y-axis movement mechanism 60 that moves the holding table 56 in a Y-axis direction that is an indexing feed direction, and an X-axis movement mechanism 70 that moves the holding table 56 in an X-axis direction that is a processing feed direction. The holding table 56 includes a holding surface 57 for holding the wafer 100.

The Y-axis movement mechanism 60 moves the holding table 56 in the Y-axis direction parallel to the holding surface 57 relative to a laser beam irradiation mechanism 80. The Y-axis movement mechanism 60 includes a pair of guide rails 63 extending in the Y-axis direction, a Y-axis table 64 placed on the guide rails 63, a ball screw 65 extending in parallel to the guide rails 63, and a drive motor 66 that rotates the ball screw 65.

The pair of guide rails 63 are disposed on the upper surface of the base 51 in parallel to the Y-axis direction. The Y-axis table 64 is set on the pair of guide rails 63 slidably along the guide rails 63. The X-axis movement mechanism 70 and the holding part 55 are placed over the Y-axis table 64.

The ball screw 65 is screwed to a nut part (not illustrated) disposed on the Y-axis table 64. The drive motor 66 is coupled to one end part of the ball screw 65 and rotationally drives the ball screw 65. Through rotational driving of the ball screw 65, the Y-axis table 64, the X-axis movement mechanism 70, and the holding part 55 move in the Y-axis direction along the guide rails 63.

The X-axis movement mechanism 70 moves the holding table 56 in the X-axis direction parallel to the holding surface 57 relative to the laser beam irradiation mechanism 80. The X-axis movement mechanism 70 includes a pair of guide rails 71 extending in the X-axis direction, an X-axis table 72 placed on the guide rails 71, a ball screw 73 extending in parallel to the guide rails 71, and a drive motor 75 that rotates the ball screw 73.

The pair of guide rails 71 are disposed on the upper surface of the Y-axis table 64 in parallel to the X-axis direction. The X-axis table 72 is set on the pair of guide rails 71 slidably along the guide rails 71. The holding part 55 is placed on the X-axis table 72.

The ball screw 73 is screwed to a nut part (not illustrated) disposed on the X-axis table 72. The drive motor 75 is coupled to one end part of the ball screw 73 and rotationally drives the ball screw 73. Through rotational driving of the ball screw 73, the X-axis table 72 and the holding part 55 move in the processing feed direction (X-axis direction) along the guide rails 71.

The holding part 55 is used for holding the wafer 100 of the frame unit 110. The holding part 55 has the holding table 56 that holds the wafer 100, four clamp parts 58 disposed around the holding table 56, and a 6 table 59 that supports the holding table 56 and rotates it in the XY-plane.

The holding table 56 is a component for holding the wafer 100 and is formed into a circular plate shape. The holding table 56 includes the holding surface 57 composed of a porous material. The holding surface 57 can communicate with a suction source that is not illustrated. The holding table 56 sucks and holds the wafer 100 in the frame unit 110 by the holding surface 57.

The four clamp parts 58 disposed around the holding table 56 clamp and fix, from four sides, the annular frame 111 around the wafer 100 held by the holding table 56.

The laser beam irradiation mechanism 80 is disposed on a front surface of the erected wall part 52 of the laser processing apparatus 4.

The laser beam irradiation mechanism 80 irradiates the wafer 100 held by the holding table 56 with a laser beam. The laser beam irradiation mechanism 80 has a processing head (light collector) 81 that irradiates the wafer 100 with the laser beam, a camera 82 that images the wafer 100, an arm part 83 that supports the processing head 81 and the camera 82, and a Z-axis movement mechanism 85 that moves the arm part 83 in a Z-axis direction.

The Z-axis movement mechanism 85 includes a pair of guide rails 86 extending in the Z-axis direction, a Z-axis table 89 placed on the guide rails 86, a ball screw 87 extending in parallel to the guide rails 86, and a drive motor 88 that rotates the ball screw 87.

The pair of guide rails 86 are disposed on the front surface of the erected wall part 52 in parallel to the Z-axis direction. The Z-axis table 89 is set on the pair of guide rails 86 slidably along the guide rails 86. The arm part 83 is attached onto the Z-axis table 89.

The ball screw 87 is screwed to a nut part (not illustrated) disposed on the Z-axis table 89. The drive motor 88 is coupled to one end part of the ball screw 87 and rotationally drives the ball screw 87. Through rotational driving of the ball screw 87, the Z-axis table 89 and the arm part 83 move in the Z-axis direction along the guide rails 86.

The arm part 83 is attached to the Z-axis table 89 in such a manner as to protrude in a −Y direction. The processing head 81 is supported by a tip of the arm part 83 in such a manner as to be opposed to the holding table 56 of the holding part 55.

Optical systems (not illustrated) of the laser beam irradiation mechanism 80, such as a laser oscillator and a collecting lens, are disposed inside the arm part 83 and the processing head 81. The laser beam irradiation mechanism 80 is configured to emit the laser beam generated by using these optical systems from the lower end of the processing head 81 toward the wafer 100 held by the holding table 56. In the present embodiment, the wavelength of the laser beam emitted from the laser beam irradiation mechanism 80 is a wavelength having absorbability with respect to the wafer 100 that is a workpiece.

Figure 5:
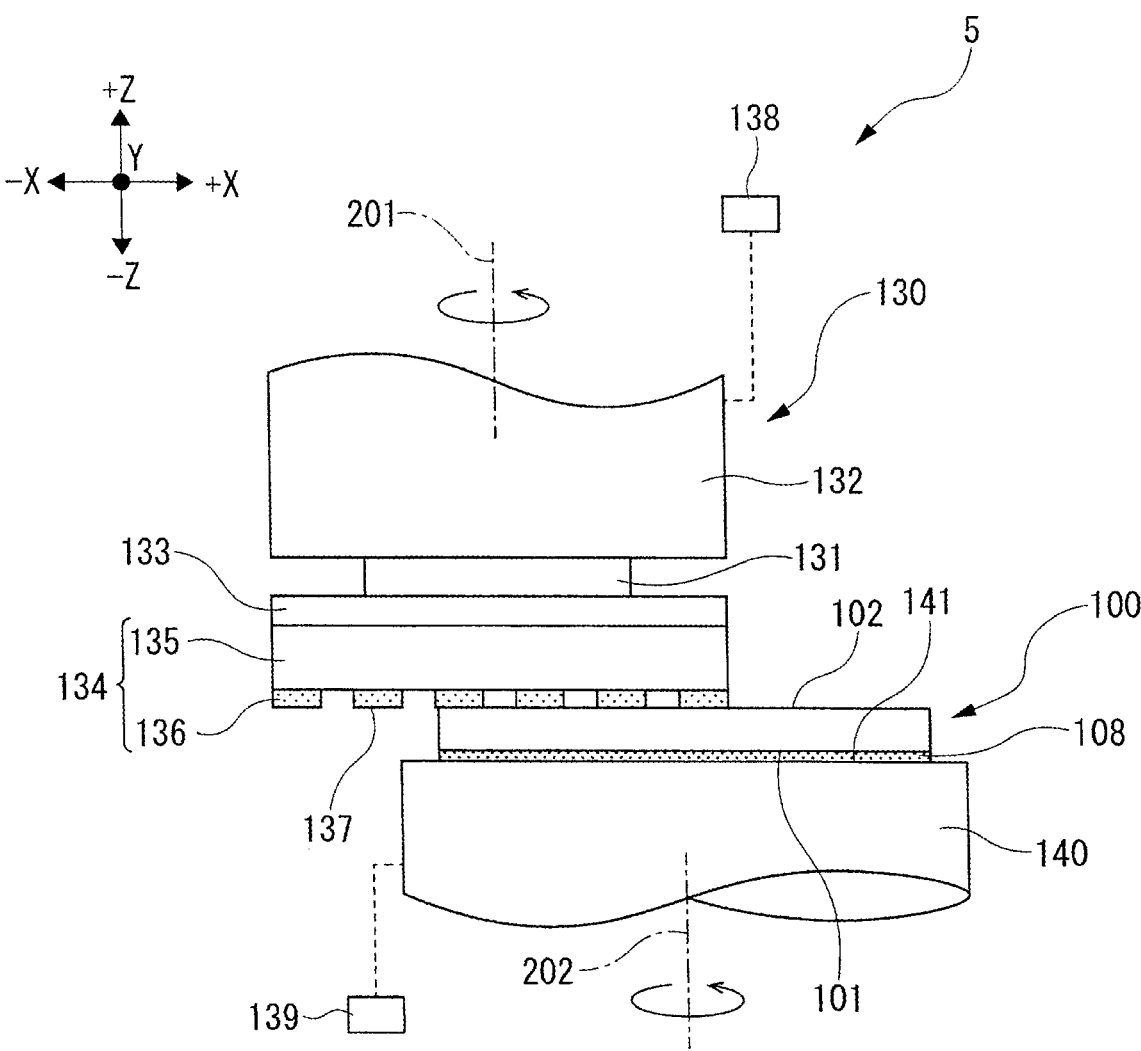
FIG. 5 is a side view illustrating a configuration of a grinding apparatus.

Next, the grinding apparatus 5 in the processing system 1 illustrated in FIG. 2 will be described. For example, the grinding apparatus 5 executes grinding processing of the wafer 100 having the protective tape 108 illustrated in FIG. 1A. As illustrated in FIG. 5, the grinding apparatus 5 includes a grinding mechanism 130 and a chuck table 140.

In a grinding step, the back surface 102 of the wafer 100 held by the chuck table 140 is ground by the grinding mechanism 130.

The grinding mechanism 130 includes a spindle 131, a spindle motor 132 that rotates the spindle 131 around a rotation axis 201 in a Z-axis direction, a mount 133 disposed at the lower end of the spindle 131, and a grinding wheel 134 mounted on the mount 133. The grinding wheel 134 includes a wheel base 135 and a plurality of grinding abrasive stones 136 that are annularly arranged on the lower surface of the wheel base 135 and have a substantially rectangular parallelepiped shape.

The grinding mechanism 130 is connected to a raising-lowering mechanism 138 and can rise and lower in the Z-axis direction by the raising-lowering mechanism 138.

The upper surface of the chuck table 140 is a holding surface 141 for holding the wafer 100. The chuck table 140 is connected to a rotation mechanism 139 and can rotate around a rotation axis 202 that passes through a center of the holding surface 141 and is along the Z-axis direction.

The conveying apparatus 6 illustrated in FIG. 2 can hold the wafer 100 having the protective tape 108 illustrated in FIG. 1A or the frame unit 110 illustrated in FIG. 1B by a holding component (not illustrated) such as a robot hand, for example. For example, the conveying apparatus 6 can carry out and carry in the wafer 100 or the frame unit 110 from and to a housing part that is not illustrated, and convey the wafer 100 or the frame unit 110 among the cutting apparatus 2, the laser processing apparatus 4, and the grinding apparatus 5. A worker may execute conveyance of the wafer 100 or the frame unit 110 without using the conveying apparatus 6.

The controller 7 illustrated in FIG. 2 includes a CPU that executes calculation processing in accordance with a control program, a storage medium such as a memory, and so forth. The controller 7 controls the respective components of the processing system 1 to execute processing of the wafer 100.

A dividing method (first dividing method) of the wafer 100 according to the present embodiment, controlled by the controller 7, will be described below. The first dividing method is a method by which the wafer 100 having the device regions 106 marked out by the planned dividing lines 103 and 104 in the front surface 101 is divided along the planned dividing lines 103 and 104.

[Back Surface Grinding Step]

In the first dividing method, first, a back surface grinding step is executed. In this back surface grinding step, the back surface 102 of the wafer 100 is ground by using the grinding apparatus 5. Thereby, in the present embodiment, the wafer 100 is ground to have a finished thickness. The finished thickness is a predetermined thickness of chips formed by dividing the wafer 100. The back surface grinding step includes the following protective tape sticking step, holding step, and grinding step.

[Protective Tape Sticking Step]

Figures 6A, 6B, 6C, 6D, 6E:
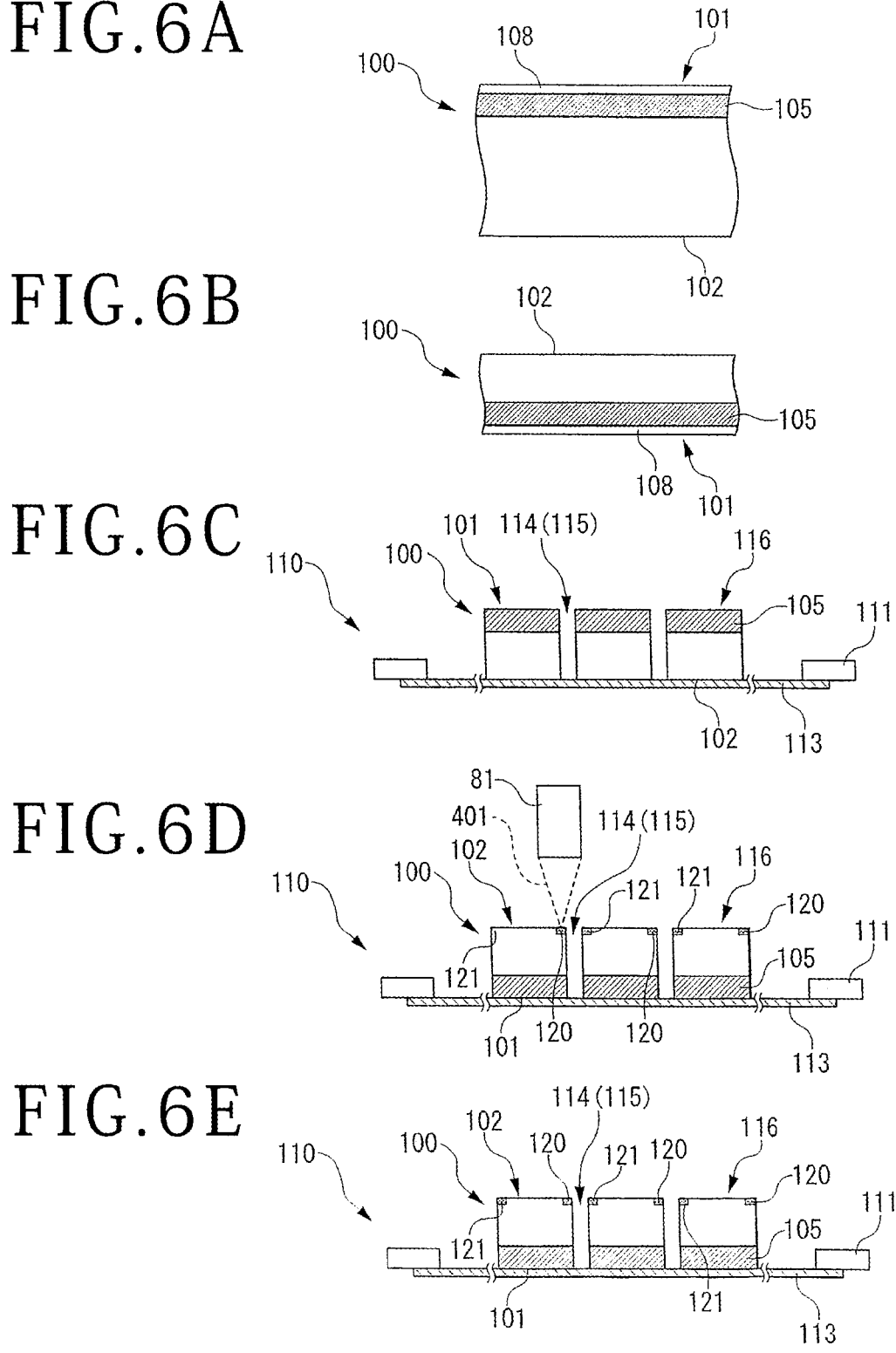
FIG. 6A to FIG. 6E are sectional views illustrating a first dividing method.

In this step, as illustrated in FIG. 6A, the protective tape 108 is stuck to the front surface 101 of the wafer 100. As illustrated in this FIG. 6A, in an example described below, a pattern layer 105 is formed in the front surface (device surface) 101 of the wafer 100. Therefore, the pattern layer 105 of the wafer 100 is protected by the protective tape 108 by sticking the protective tape 108 to the front surface 101.

[Holding Step]

In this step, by the conveying apparatus 6 or a worker, the wafer 100 is placed on the holding surface 141 of the chuck table 140 in the grinding apparatus 5 illustrated in FIG. 5 with the protective tape 108 stuck to the front surface 101 oriented toward the side of the holding surface 141. Then, the controller 7 causes a suction source that is not illustrated to communicate with the holding surface 141 to suck the protective tape 108 by the holding surface 141. This causes the wafer 100 to be sucked and held by the holding surface 141 with the interposition of the protective tape 108 in the state in which the back surface 102 is oriented upward.

[Grinding Step]

Next, a grinding step is executed. In this step, the controller 7 rotates the chuck table 140 around the rotation axis 202 in the Z-axis direction by the rotation mechanism 139 to rotate the wafer 100 held by the chuck table 140. Furthermore, the controller 7 rotates the grinding abrasive stones 136 around the rotation axis 201 by rotating the spindle 131 by the spindle motor 132. In this state, the controller 7 lowers the grinding mechanism 130 in a −Z direction by the raising-lowering mechanism 138.

Thereby, lower surfaces 137 of the grinding abrasive stones 136 get contact with the back surface 102 of the wafer 100 and the back surface 102 is ground. The controller 7 executes, for example, thickness measurement of the wafer 100 by a thickness measurement mechanism that is not illustrated in the grinding of the wafer 100 by the grinding mechanism 130, and ends the grinding when a thickness of the wafer 100 has become the finished thickness. Through this, the back surface 102 of the wafer 100 is ground and the wafer 100 having the finished thickness like one illustrated in FIG. 6B is obtained.

[Dividing Step]

Next, a dividing step is executed. In this step, the wafer 100 is divided from the front surface 101 along the first planned dividing lines 103 and the second planned dividing lines 104 to form a plurality of chips. The dividing step includes the following frame unit forming step, holding step, and cutting step.

[Frame Unit Forming Step]

In this step, the protective tape 108 is peeled off from the front surface 101 of the wafer 100 ground to the predetermined thickness in the back surface grinding step. Then, in the state in which the wafer 100 is positioned in the opening 112 of the annular frame 111 illustrated in FIG. 1B, the dicing tape 113 is stuck to the back surface 102 of the wafer 100 and the annular frame 111. Thereby, the annular frame 111 and the wafer 100 are integrated by the dicing tape 113 and the frame unit 110 in which the front surface 101 is oriented upward is formed.

[Holding Step]

Next, by the conveying apparatus 6 or the worker, the wafer 100 of the frame unit 110 is placed over the holding table 21 of the holding part 20 in the cutting apparatus 2 illustrated in FIG. 3 with the interposition of the dicing tape 113. Moreover, the annular frame 111 of the frame unit 110 is supported by the clamp parts 25 of the holding part 20. In this state, the controller 7 causes the holding surface 22 of the holding table 21 to communicate with the suction source that is not illustrated to suck and hold the wafer 100 by the holding surface 22. In this manner, the frame unit 110 including the wafer 100 is held by the holding part 20.

[Cutting Step]

In this step, the wafer 100 is cut along the a plurality of first planned dividing lines 103 and second planned dividing lines 104 (see FIG. 1B). Thereby, processing grooves (dividing grooves) are formed along the first planned dividing lines 103 and the second planned dividing lines 104 and the wafer 100 is divided by using these grooves.

Specifically, first, the controller 7 controls the θ table 23 of the holding part 20 illustrated in FIG. 3 and rotates the holding table 21 to cause the first planned dividing lines 103 of the wafer 100 held by the holding surface 22 of the holding table 21 to become parallel to the X-axis direction. Thereafter, the controller 7 controls the processing feed mechanism 14 to dispose the holding part 20 at a predetermined cutting start position below the cutting mechanism 45.

Moreover, the controller 7 controls the indexing feed mechanism 30 to adjust the position of the cutting blade 46 in the Y-axis direction to one first planned dividing line 103 in the wafer 100.

Thereafter, while rotating the cutting blade 46 at high speed, the controller 7 controls the cutting-in feed mechanism 40 to lower the cutting blade 46 of the cutting mechanism 45 to such a predetermined cutting height as to cut off (fully cut) the wafer 100 sucked and held by the holding surface 22.

In this state, the controller 7 controls the processing feed mechanism 14 to move the holding part 20 that holds the frame unit 110 in the X-axis direction. This causes the cutting blade 46 that rotates to cut the wafer 100 along the one first planned dividing line 103. As a result, as illustrated in FIG. 6C, a first processing groove 114 that is the processing groove (cut groove) along the first planned dividing line 103 is formed in the wafer 100. In this case, the first processing groove 114 is formed to have such a depth as to cut off the wafer 100 and reach the dicing tape 113.

Thereafter, the controller 7 controls the cutting-in feed mechanism 40 illustrated in FIG. 3 to separate the cutting blade 46 from the wafer 100 and dispose the cutting blade 46 above the wafer 100. Moreover, the controller 7 controls the processing feed mechanism 14 to return the holding part 20 to the cutting start position. Then, the controller 7 controls the indexing feed mechanism 30 to adjust the position of the cutting blade 46 in the Y-axis direction to another first planned dividing line 103 to be cut next in the wafer 100, and cuts the wafer 100 along the first planned dividing line 103.

In this manner, the controller 7 cuts the wafer 100 along all the first planned dividing lines 103 in the wafer 100.

Next, the controller 7 controls the θ table 23 of the holding part 20 illustrated in FIG. 3 and rotates the holding table 21 to cause the second planned dividing lines 104 of the wafer 100 held by the holding surface 22 of the holding table 21 to become parallel to the X-axis direction.

Thereafter, similarly to the cutting along the first planned dividing lines 103, the controller 7 controls the processing feed mechanism 14, the indexing feed mechanism 30, the cutting-in feed mechanism 40, and the cutting mechanism 45 to form second processing grooves 115 along all second planned dividing lines 104 in the wafer 100 by the cutting blade 46 as illustrated in FIG. 6C. The second processing grooves 115 also have a depth similar to that of the first processing grooves 114.

This causes the wafer 100 to be divided by the first processing grooves 114 and the second processing grooves 115, and a plurality of chips 116 having the finished thickness are formed.

[First Energy Supply Step]

Next, a first energy supply step is executed. In this step, energy is supplied to at least any part of the edges (outer circumferential parts), the back surfaces, and the side surfaces of the chips 116 from the back surface 102 of the wafer 100 and the part supplied with the energy is melted to repair at least part of processing strain. This processing strain is what is caused due to the back surface grinding step and/or the dividing step, for example. This processing strain is a processing alteration part including damage such as the lowering of the strength, crack, stretch, and chipping that occur at the time of formation of the chips, for example.

In the present embodiment, the first energy supply step includes the following frame unit forming step, holding step, and laser beam irradiation step.

[Frame Unit Forming Step]

In this step, the wafer 100 divided into the chips 116 is changed (transferred) from the frame unit 110 used in the dividing step to another frame unit 110. That is, with use of the wafer 100 divided into the chips 116, another annular frame 111, and another dicing tape 113, a new frame unit 110 in which the back surface 102 that is the ground surface of the wafer 100 is oriented upward is formed as illustrated in FIG. 6D.

In the present embodiment, the first energy irradiation step is a step of irradiating the edges of the chips 116 with a laser beam. Specifically, in the present embodiment, the edges of the chips 116 are irradiated with the laser beam by using the laser processing apparatus 4 in the first energy supply step.

The edges of the chips 116 are the edges of the first processing grooves 114 and the second processing grooves 115 (peripheral parts of the processing grooves) in the front surface of the wafer 100 illustrated in FIG. 6D and include first edge parts 120 and second edge parts 121 extending along both sides of the processing grooves 114 and 115. It is also possible to express the edges of the chips 116 as upper surfaces or edge surfaces of the sides of the processing grooves 114 and 115, for example.

[Holding Step]

In this step, by the conveying apparatus 6 or the worker, the wafer 100 of the frame unit 110 illustrated in FIG. 6D is placed over the holding table 56 of the holding part 55 in the laser processing apparatus 4 illustrated in FIG. 4 with the interposition of the dicing tape 113. Moreover, the annular frame 111 of the frame unit 110 is supported by the clamp parts 58 of the holding part 55. In this state, the controller 7 causes the holding surface 57 of the holding table 56 to communicate with the suction source that is not illustrated to suck and hold the wafer 100 by the holding surface 57. In this manner, the frame unit 110 including the wafer 100 is held by the holding part 55.

[Laser Beam Irradiation Step]

In this step, the edges of the chips 116 are irradiated with the laser beam. Specifically, first, the controller 7 controls the θ table 59 of the holding part 55 illustrated in FIG. 4 and rotates the holding table 56 to cause the first processing grooves 114 of the wafer 100 held by the holding surface 57 of the holding table 56 to become parallel to the X-axis direction. Thereafter, the controller 7 controls the X-axis movement mechanism 70 to dispose the holding part 55 at a predetermined irradiation start position below the processing head 81 of the laser beam irradiation mechanism 80.

Moreover, the controller 7 controls the Y-axis movement mechanism 60 to dispose the first edge part 120 (see FIG. 6D) of one first processing groove 114 in the wafer 100 below the processing head 81. Furthermore, the controller 7 controls the Z-axis movement mechanism 85 of the laser beam irradiation mechanism 80 to properly adjust a height of the processing head 81.

In this state, the controller 7 controls the optical system of the laser beam irradiation mechanism 80 to generate the laser beam and emit the laser beam downward from the processing head 81. In addition, the controller 7 controls the X-axis movement mechanism 70 to move the holding part 55 that holds the frame unit 110 in the X-axis direction. Thereby, as illustrated in FIG. 6D, irradiation with a laser beam 401 output from the processing head 81 is executed along the first edge part 120 of the one first processing groove 114.

Thereafter, the controller 7 stops the irradiation with the laser beam 401 and controls the X-axis movement mechanism 70 to return the holding part 55 to the irradiation start position. Then, the controller 7 controls the Y-axis movement mechanism 60 to dispose the second edge part 121 of the first processing groove 114 below the processing head 81, and executes irradiation with the laser beam 401 along the second edge part 121.

In this manner, the controller 7 executes irradiation with the laser beam 401 along the first edge parts 120 and the second edge parts 121 of all first processing grooves 114 in the wafer 100.

Next, the controller 7 controls the θ table 59 of the holding part 55 illustrated in FIG. 4 and rotates the holding table 56 to cause the second processing grooves 115 of the wafer 100 held by the holding surface 57 of the holding table 56 to become parallel to the X-axis direction.

Thereafter, similarly to the laser irradiation along the first processing grooves 114, the controller 7 controls the Y-axis movement mechanism 60, the X-axis movement mechanism 70, and the laser beam irradiation mechanism 80 to execute irradiation with the laser beam 401 along the first edge parts 120 and the second edge parts 121 of all second processing grooves 115. In this manner, the edges of all chips 116 in the wafer 100 are irradiated with the laser beam 401 as illustrated in FIG. 6E.

As above, in the present embodiment, after the dividing step, the first energy supply step is executed to supply energy through irradiating the edges of the chips 116 with the laser beam 401 from the side of the back surface 102 of the wafer 100. This causes the edges of the chips 116 to be melted by the laser beam 401.

Furthermore, in the present embodiment, the laser beam 401 with a wavelength having absorbability with respect to the wafer 100 is used. Therefore, not only the surfaces of the edges of the chips 116 but also parts from the surface to a predetermined thickness (surface neighboring parts) are also melted. Then, the melted regions of the chips 116 are cooled and solidified after the laser irradiation.

By such a process of melting and cooling, in the present embodiment, crystal growth of the melted regions of the chips 116, which are the parts irradiated with the laser beam 401 (laser-irradiated parts), is caused to form seed crystals and then recrystallization can be caused. Therefore, the surfaces of the edges of the chips 116 can be planarized. Moreover, it is possible to repair processing alteration regions such as cracks and chipping caused in the surfaces and the surface neighboring parts of the edges of the chips 116 in the back surface grinding step and/or the dividing step. This makes it possible to alleviate processing strain of the edges of the chips 116. That is, it is possible to repair (or remove) at least part of processing strain caused in the chips 116 in the back surface grinding step and/or the dividing step. As a result, the flexural strength of the chips 116 can be enhanced.

Furthermore, in the first energy supply step, irradiation with the laser beam is executed from the side of the back surface 102 of the wafer 100 in order to repair processing strain of the chips 116. Therefore, even in the case in which devices are formed on the front surface 101 of the wafer 100, an adverse effect on the devices due to the laser beam can be suppressed.

In the first energy supply step, the part irradiated with the laser beam is not limited to the edges of the chips 116 and it suffices to irradiate at least any part of the edges, the back surfaces, and the side surfaces of the chips 116 with the laser beam in order to repair processing strain. Also, for the back surface side or the side surfaces of the chips 116, at least part of processing strain caused therein can be repaired by supplying energy (for example, executing irradiation with the laser beam).

Moreover, there is a method referred to as laser cleaning in which processing dust that adheres to processing grooves for forming the chips 116 is scraped off by irradiation with a laser beam after formation of the processing grooves. Regarding this, in the laser cleaning, by irradiating the processing grooves with the laser beam with a UV wavelength, the processing dust that adheres to the surfaces of the processing grooves is caused to absorb the laser beam and ablation thereof is caused to remove this processing dust. That is, the laser cleaning is executed in order to sublime and remove the processing dust that adheres to the surfaces.

On the other hand, in the present embodiment, by irradiation with the laser beam 401, processing strain is repaired through not only planarizing the surfaces of the laser-irradiated parts such as the first edge parts 120 and the second edge parts 121, which are the edges of the chips 116 in the wafer 100, but also coupling cracks and so forth formed inside (surface neighboring parts). Therefore, it is preferable that the laser beam 401 be not excessively absorbed by the surfaces of the laser-irradiated parts. Thus, in the present embodiment, it is preferable to melt the surfaces of the laser-irradiated pats and the parts from the surface to the predetermined thickness (surface neighboring parts) by using the laser beam 401 with a wavelength longer than that of the laser beam with which irradiation is executed in the laser cleaning, for example, a wavelength in a range of 500 to 1000 nm. For example, the surface neighboring part is a part from the surface to a thickness of approximately 0.5 to 1.5 μm or 0.5 to 4 μm.

Furthermore, the first dividing method according to the present embodiment may further include a second energy supply step (front surface energy supply step). This step is executed between the dividing step and the first energy supply step, for example.

In this second energy supply step, energy is supplied to at least any part of the edges, the back surfaces, and the side surfaces (for example, the side surfaces of the chips 116 in regions close to the front surface 101) of the chips 116 from the front surface 101 of the wafer 100 and the part supplied with the energy is melted. This repairs at least part of processing strain caused due to the dividing step, for example.

Figure 7A:
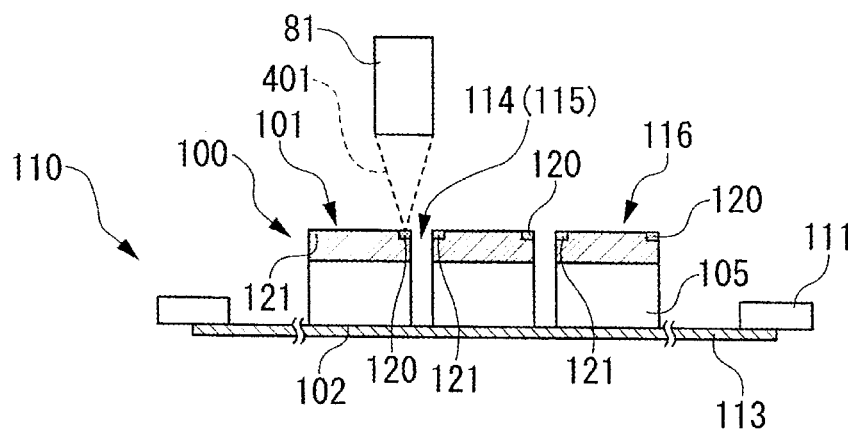
FIG. 7A to FIG. 7C are sectional views illustrating the first dividing method including a second energy supply step.

In the present embodiment, in the second energy supply step, the frame unit 110 illustrated in FIG. 6C, in which the front surface 101 of the wafer 100 is oriented upward, after the dividing step, is conveyed to the laser processing apparatus 4. Then, as illustrated in FIG. 7A, the edges of all chips 116, that is, the first edge parts 120 and the second edge parts 121 of all first processing grooves 114 and second processing grooves 115, are irradiated with the laser beam 401 from the front surface 101 of the wafer 100 similarly to the holding step and the laser beam irradiation step of the above-described first energy supply step.

Figure 7B:
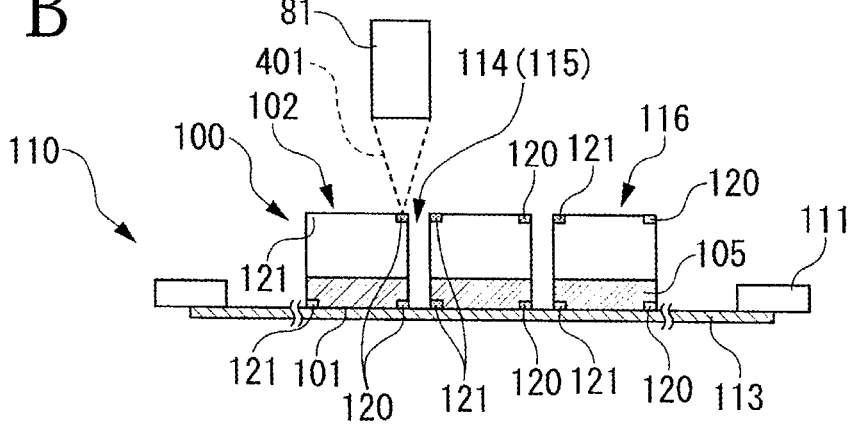
Figure 7C:
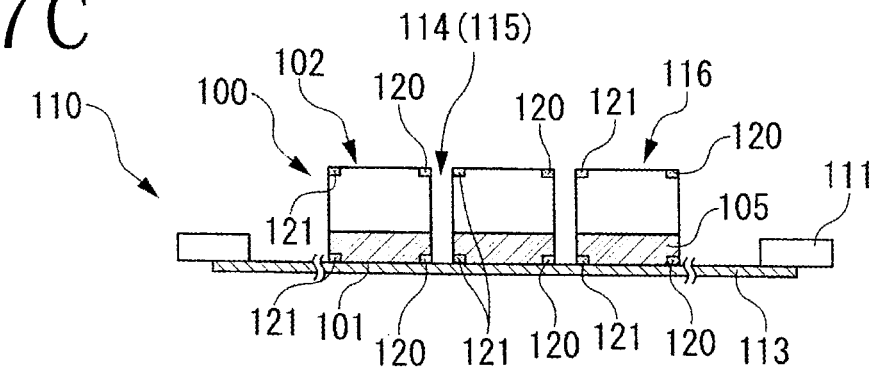

Thereby, at least part of processing strain caused on the front surface side (side of the pattern layer 105) of the chips 116 is repaired. Thereafter, as illustrated in FIG. 7B and FIG. 7C, with use of the wafer 100 after the second energy supply step, the frame unit 110 in which the back surface 102 that is the ground surface of the wafer 100 is oriented upward is formed and the above-described first energy supply step is executed.

Depending on the wafer 100, the pattern layer 105 is thick in some cases, for example, the pattern layer 105 is thicker than the substrate layer (base layer) that is the main body of the wafer 100 in some cases. For example, in some cases, a thickness of the substrate layer is approximately 10 μm whereas a thickness of the functional layer is 20 to 30 μm. When the pattern layer 105 is thick as above, processing strain caused in the pattern layer 105 affects the flexural strength of chips when the wafer 100 is turned to the chips.

Thus, when the pattern layer 105 is thick, it is particularly effective to repair at least part of processing strain by irradiating at least any of the edges, the back surfaces, and the side surfaces of the chips 116 on the side of the pattern layer 105 (that is, any of parts formed from the pattern layer 105 in the chips 116) with the laser beam 401 to melt and solidify the irradiated parts in the second energy supply step.

As above, when the pattern layer 105 is disposed in the wafer 100, parts composed of the pattern layer 105 and/or parts composed of the substrate layer in at least any of the edges, the back surfaces, and the side surfaces of the chips 116 may be irradiated with the laser beam 401 and be melted to repair at least part of processing strain therein.

Furthermore, in the case of irradiating the pattern layer 105 with the laser beam, it is preferable to limit the output power of the laser beam 401 to such a degree that a superficial layer of the surface irradiated with the laser beam 401 is melted to avoid the occurrence of new damage to the pattern layer 105 due to heat of the laser beam 401.

Second Embodiment

In the present embodiment, a second dividing method that is a modification example of the first dividing method described in the first embodiment will be described.

The second dividing method is also a method by which the wafer 100 having the device regions 106 marked out by the planned dividing lines 103 and 104 in the front surface 101 is divided along the planned dividing lines 103 and 104.

[Processing Groove Forming Step]

First, a processing groove forming step is executed. In this step, processing grooves deeper than a finished thickness are formed in the wafer 100 from the front surface 101. Specifically, by using the cutting apparatus 2, the processing grooves deeper than the finished thickness are formed in the wafer 100 along the first planned dividing lines 103 and the second planned dividing lines 104 illustrated in FIG. 1B. In the second dividing method, the processing groove forming step includes a frame unit forming step, a holding step, and a cutting step similarly to the dividing step of the above-described first dividing method.

[Frame Unit Forming Step]

In this step, in the state in which the wafer 100 is positioned in the opening 112 of the annular frame 111 illustrated in FIG. 1B, the dicing tape 113 is stuck to the back surface 102 of the wafer 100 and the annular frame 111. Thereby, the annular frame 111 and the wafer 100 are integrated by the dicing tape 113 and the frame unit 110 in which the front surface 101 is oriented upward is formed.

[Holding Step]

In this step, the frame unit 110 including the wafer 100 is held by the holding part 20 of the cutting apparatus 2 similarly to the holding step of the dividing step of the first dividing method.

[Cutting Step]

In this step, the wafer 100 is cut along the plurality of first planned dividing lines 103 formed in the first direction and the plurality of second planned dividing lines 104 formed in the second direction (see FIG. 1B). This forms the processing grooves deeper than the finished thickness along the first planned dividing lines 103 and the second planned dividing lines 104.

Figures 8A, 8B, 8C, 8D, 8E:
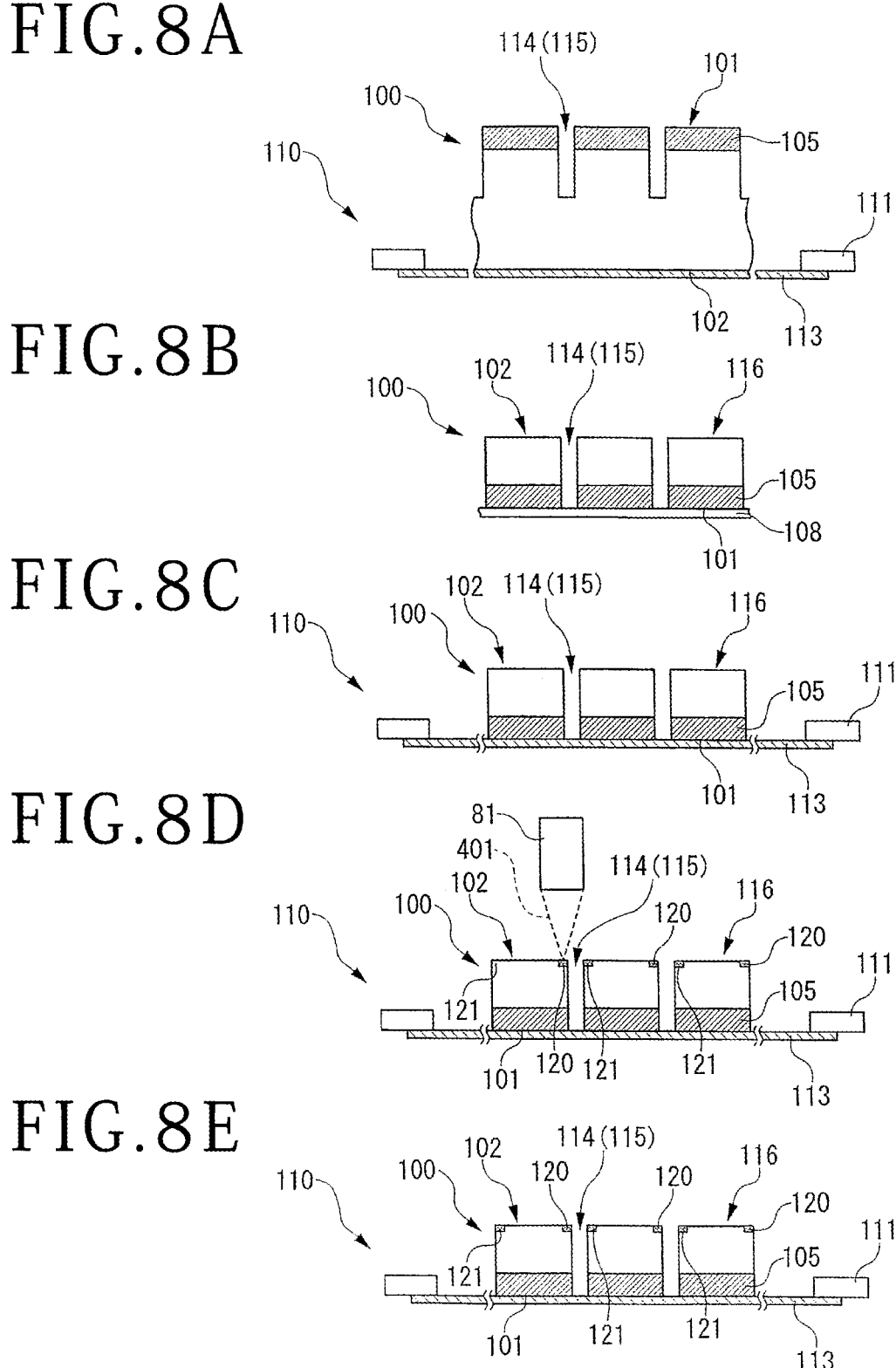
FIG. 8A to FIG. 8E are sectional views illustrating a second dividing method.

Specifically, similarly to the cutting step of the dividing step of the first dividing method, the controller 7 controls the respective components of the cutting apparatus 2 to cut the wafer 100 along all the first planned dividing lines 103 and second planned dividing lines 104 in the wafer 100 of the frame unit 110 held by the holding part 20. As a result, as illustrated in FIG. 8A, the first processing grooves 114 along the first planned dividing lines 103 and the second processing grooves 115 along the second planned dividing lines 104 are formed in the wafer 100. In this case, the first processing grooves 114 and the second processing grooves 115 are formed to have a depth that is such a depth as not to divide the wafer 100 (such a depth as not to reach the dicing tape 113) and is deeper than the finished thickness.

[Back Surface Grinding Step]

Next, a back surface grinding step is executed. In this back surface grinding step, after the processing groove forming step, the wafer 100 is ground to the finished thickness from the back surface 102 of the wafer 100 to divide the wafer 100 and form the a plurality of chips 116. In the second dividing method, the back surface grinding step includes a protective tape sticking step, a holding step, and a grinding step similarly to the back surface grinding step of the above-described first dividing method.

[Protective Tape Sticking Step]

In this step, the wafer 100 in which the first processing grooves 114 and the second processing grooves 115 have been formed is separated from the frame unit 110 used in the processing groove forming step. In addition, the protective tape 108 is stuck to the front surface 101 of the wafer 100 as illustrated in FIG. 1A. Due to this, the pattern layer 105 of the wafer 100 is protected by the protective tape 108.

[Holding Step]

In this step, the wafer 100 is sucked and held by the holding surface 141 of the chuck table 140 in the grinding apparatus 5 illustrated in FIG. 5 with the interposition of the protective tape 108 in the state in which the back surface 102 is oriented upward similarly to the holding step of the back surface grinding step of the first dividing method.

[Grinding Step]

In this step, the controller 7 grinds the back surface 102 of the wafer 100 by the grinding abrasive stones 136 until the thickness of the wafer 100 becomes the finished thickness similarly to the grinding step of the back surface grinding step of the first dividing method. Here, the first processing grooves 114 and the second processing grooves 115 formed in the wafer 100 have been formed more deeply than the finished thickness. Therefore, by this grinding step, the wafer 100 is divided and the plurality of chips 116 having the finished thickness are formed as illustrated in FIG. 8B.

[First Energy Supply Step]

Next, a first energy supply step is executed. In this step, energy is supplied to at least any part of the edges (outer circumferential parts), the back surfaces, and the side surfaces of the chips 116 from the back surface 102 of the wafer 100 and the part supplied with the energy is melted to repair at least part of processing strain similarly to the first energy supply step of the first dividing method. This processing strain is what is caused due to the processing groove forming step and/or the back surface grinding step, for example.

In the second dividing method, the first energy supply step includes a frame unit forming step, a holding step, and a laser beam irradiation step similarly to the first energy supply step of the first dividing method.

[Frame Unit Forming Step]

In this step, the frame unit 110 illustrated in FIG. 1B is formed with use of the wafer 100 divided into the chips 116. At this time, the protective tape 108 is removed from the wafer 100. This forms the frame unit 110 in which the back surface 102 that is the ground surface of the wafer 100 is oriented upward as illustrated in FIG. 8C.

[Holding Step]

In this step, the frame unit 110 including the wafer 100 is held by the holding part 55 of the laser processing apparatus 4 illustrated in FIG. 4 similarly to the holding step of the first energy supply step of the first dividing method.

[Laser Beam Irradiation Step]

In this step, the edges of the chips 116 are irradiated with a laser beam with a wavelength having absorbability with respect to the wafer 100 similarly to the laser beam irradiation step of the first energy supply step of the first dividing method. That is, as illustrated in FIG. 8D, the controller 7 executes irradiation with the laser beam 401 from the processing head 81 along the first edge parts 120 and the second edge parts 121 of all first processing grooves 114 in the wafer 100 and the first edge parts 120 and the second edge parts 121 of all second processing grooves 115.

In this manner, the edges of all chips 116 in the wafer 100 are irradiated with the laser beam 401 as illustrated in FIG. 8E.

In such a second dividing method, after the back surface grinding step, the first energy supply step is executed to supply energy through irradiating the edges of the chips 116 with the laser beam 401 from the side of the back surface 102 of the wafer 100. This causes the edges of the chips 116 to be melted by the laser beam 401. Thereafter, the edges of the chips 116 are cooled and solidified to be recrystallized and thereby be planarized. Moreover, at this time, cracks, chipping, and so forth caused in the surfaces and the surface neighboring parts of the edges of the chips 116 are coupled and processing distortion in the edges of the chips 116 is alleviated. That is, at least part of the processing strain can be repaired (or removed). As a result, the flexural strength of the chips 116 can be enhanced.

Furthermore, because irradiation with the laser beam is executed from the side of the back surface 102 of the wafer 100 in the first energy supply step, an adverse effect on the device regions in the front surface 101 of the wafer 100 due to the laser beam can be suppressed.

Also, in the second dividing method, in the first energy supply step, the part irradiated with the laser beam is not limited to the edges of the chips 116 and it suffices to irradiate at least any part of the edges, the back surfaces, and the side surfaces of the chips 116 with the laser beam in order to repair processing strain.

Moreover, the second dividing method may further include a second energy supply step (front surface energy supply step) similarly to the first dividing method. This step is executed between the processing groove forming step and the back surface grinding step, for example.

In this step, as described above, energy is supplied to at least any part of the edges, the back surfaces, and the side surfaces (for example, the side surfaces of the chips 116 in regions close to the front surface 101) of the chips 116 (that is, parts to become the chips 116 after the back surface grinding step) from the front surface 101 of the wafer 100 and the part supplied with the energy is melted. This repairs at least part of processing strain caused due to the processing groove forming step, for example.

Figures 9A, 9B, 9C, 9D, 9E:
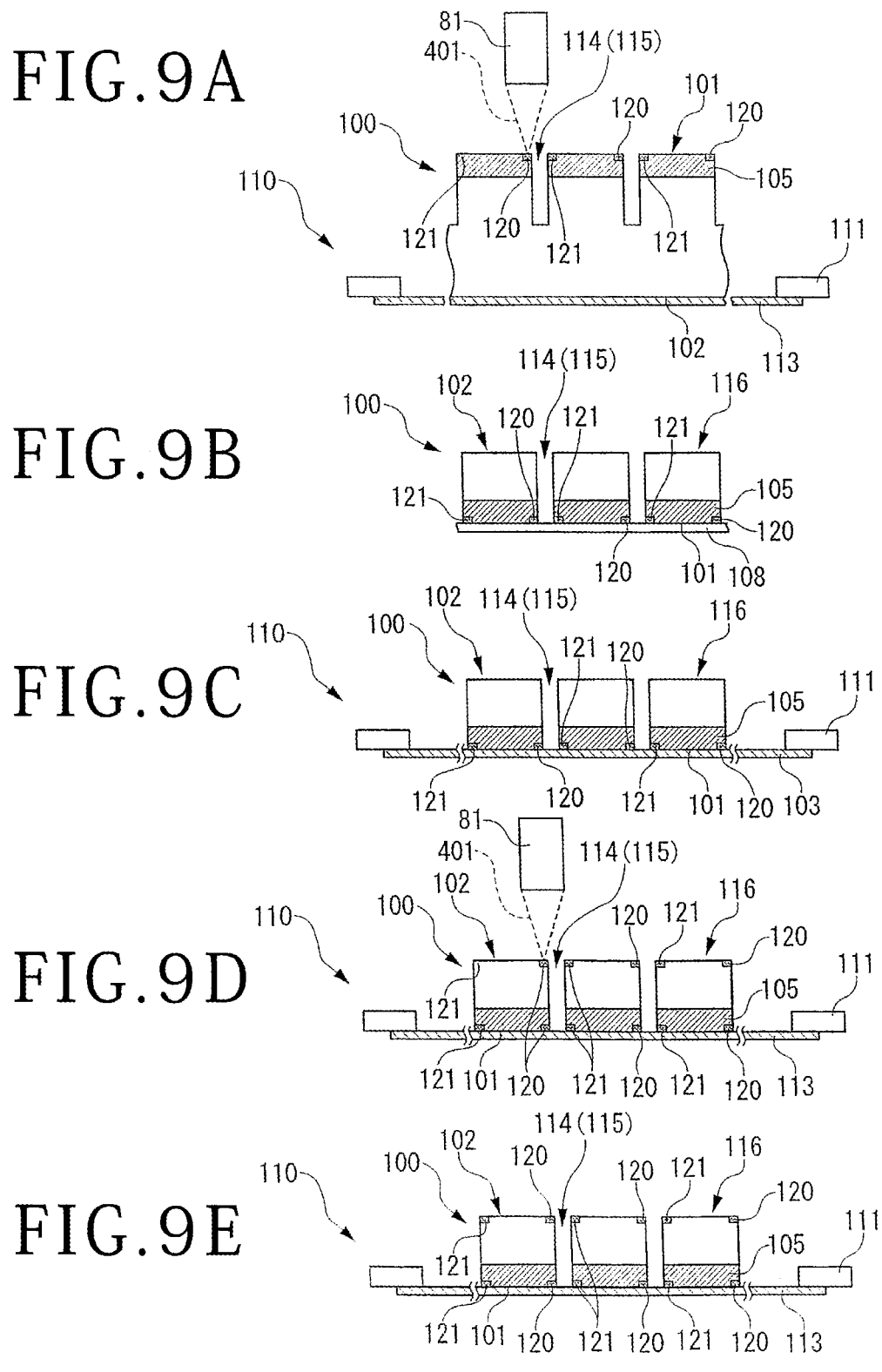
FIG. 9A to FIG. 9E are sectional views illustrating the second dividing method including a second energy supply step.

In the second dividing method, in the case of executing the second energy supply step, the frame unit 110 illustrated in FIG. 8A, in which the front surface 101 of the wafer 100 is oriented upward, after the processing groove forming step, is conveyed to the laser processing apparatus 4. Then, as illustrated in FIG. 9A, the edges of all chips 116, that is, the first edge parts 120 and the second edge parts 121 of all first processing grooves 114 and second processing grooves 115, are irradiated with the laser beam 401 from the front surface 101 of the wafer 100 similarly to the holding step and the laser beam irradiation step of the above-described first energy supply step. Thereby, at least part of processing strain caused on the front surface side (side of the pattern layer 105) of the chips 116 is repaired. Thereafter, the above-described back surface grinding step and first energy supply step are executed for the wafer 100 after the second energy supply step as illustrated in FIG. 9B to FIG. 9E.

In the above-described embodiments, the processing system 1 includes the cutting apparatus 2 in order to form the first processing grooves 114 and the second processing grooves 115 in the wafer 100 in the dividing step of the first dividing method and the processing groove forming step of the second dividing method. Regarding this, the processing system 1 may include, instead of the cutting apparatus 2, the laser processing apparatus for groove formation that is for forming the first processing grooves 114 and the second processing grooves 115 and is different from the laser processing apparatus 4.

The laser processing apparatus for groove formation has a configuration similar to the laser processing apparatus 4 illustrated in FIG. 4, for example. However, the laser beam for forming the first processing grooves 114 and the second processing grooves 115 and the laser beam for repairing processing strain of the chips 116 are different from each other in the wavelength, the output power, and so forth. Thus, the laser processing apparatus for groove formation is configured to execute irradiation with a laser beam suitable to form the first processing grooves 114 and the second processing grooves 115.

Alternatively, in the processing system 1, the laser processing apparatus 4 may be configured to include two kinds of laser oscillators and allow irradiation with the laser beam suitable to form the first processing grooves 114 and the second processing grooves 115 and the laser beam suitable to repair processing strain of the chips 116 with switching between these laser beams. In this case, the processing system 1 can execute the above-described dividing step, processing groove forming step, first energy supply step, and second energy supply step by one piece of the laser processing apparatus 4.

Furthermore, in the processing system 1, the dividing step and the processing groove forming step may be executed by plasma etching. That is, the processing system 1 may include a plasma etching apparatus for forming the first processing grooves 114 and the second processing grooves 115 instead of the cutting apparatus 2.

Moreover, in the above-described first dividing method and second dividing method, in the first energy supply step, the edges of the chips 116 (first edge parts 120 and second edge parts 121) in the frame unit 110 in which the back surface 102 is oriented upward are irradiated with the laser beam 401 as illustrated in FIG. 6D and FIG. 8D.

Regarding this, the back surfaces of the chips 116 may be irradiated with the laser beam 401. The back surfaces of the chips 116 are the surface on the side on which the pattern layer 105 is not formed (surfaces corresponding to the back surface 102 of the wafer 100) in the chips 116. This can repair at least part of processing strain formed in the back surfaces of the chips 116.

Alternatively, the side surfaces of the chips 116 may be irradiated with the laser beam 401. In this case, for example, the holding part 55 of the laser processing apparatus 4 illustrated in FIG. 4 has a holding mechanism 90 instead of the holding table 56 as illustrated in FIG. 10.

The holding mechanism 90 includes, around a holding pedestal 91, clamp parts 58 that clamp and fix the annular frame 111 around the wafer 100 in the frame unit 110. Moreover, the holding mechanism 90 has a movement mechanism 93 of a ball screw system fixed onto the holding pedestal 91 and a pushing-up component 92 supported by the movement mechanism 93.

Figure 10:
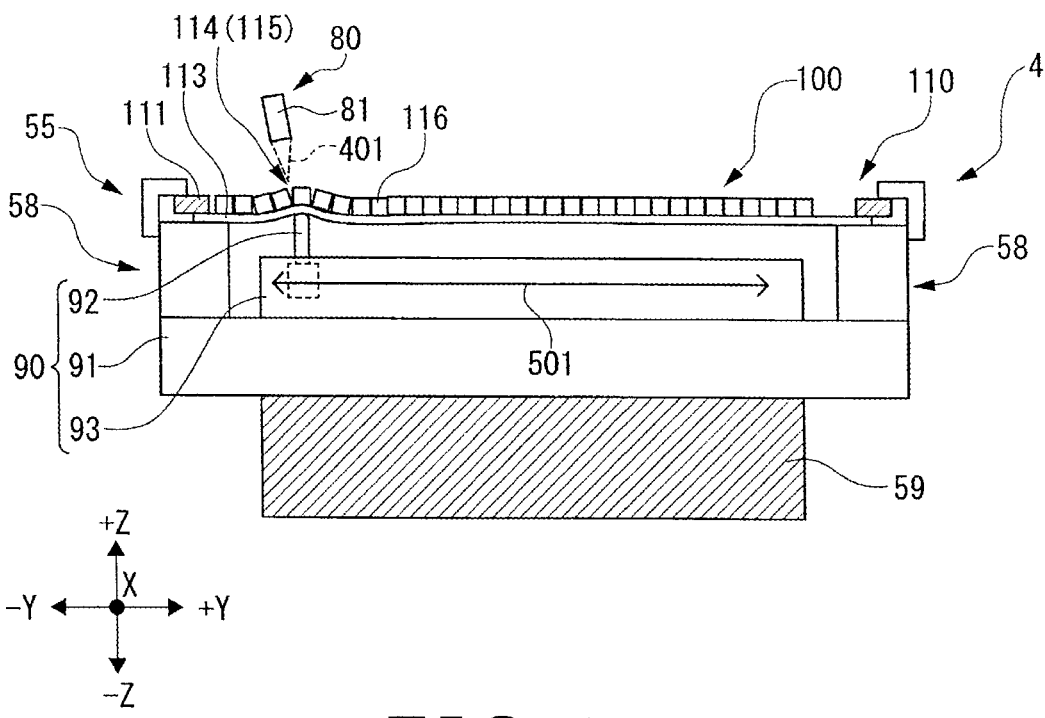
FIG. 10 is a sectional view illustrating another example of a holding part in the laser processing apparatus.
Figure 11:
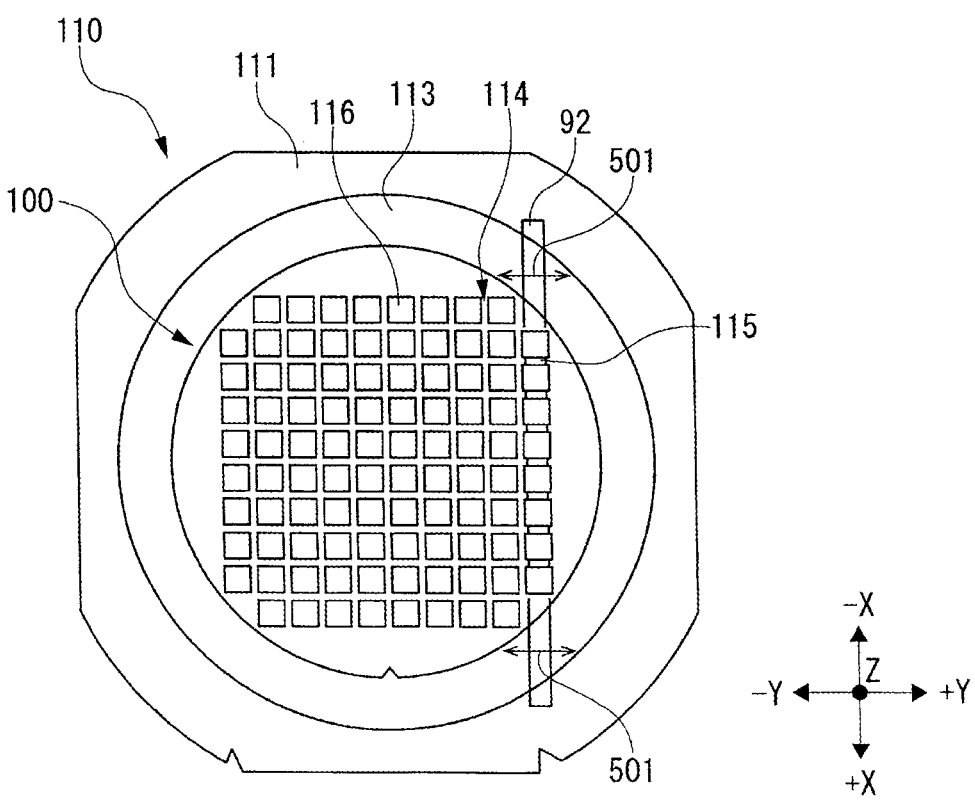
FIG. 11 is a plan view illustrating a pushing-up component.

The movement mechanism 93 can move the pushing-up component 92 along the Y-axis direction as illustrated by arrows 501 in FIG. 10 and FIG. 11 and move the pushing-up component 92 in the upward-downward direction. As illustrated in FIG. 11, the pushing-up component 92 is a substantially plate-shaped component longer than the diameter of the wafer 100 and extends in the diameter direction of the wafer 100 in such a manner as to be in contact with the wafer 100 with the interposition of the dicing tape 113. The width (length in the Y-axis direction) of the part in contact with the wafer 100 in the pushing-up component 92 is equivalent to the width of the chips 116.

In this configuration, in the first energy supply step, the annular frame 111 of the frame unit 110 is supported by the clamp parts 58 of the holding part 55 in the laser processing apparatus 4 illustrated in FIG. 10 (holding step).

Then, as illustrated in FIG. 10, the controller 7 adjusts the Y-axis movement mechanism 60 (see FIG. 4) and the θ table 59 to cause the chips 116 on one row along one first processing groove 114 extending in the X-axis direction to be irradiated with the laser beam 401 output from the processing head 81. Moreover, the controller 7 adjusts a tilt of the processing head 81 to cause the laser beam 401 output from the processing head 81 to be diagonally applied to the wafer 100. The laser beam 401 may be tilted by a mirror (not illustrated) disposed inside the processing head 81 instead of adjusting the tilt of the processing head 81.

Figure 12:
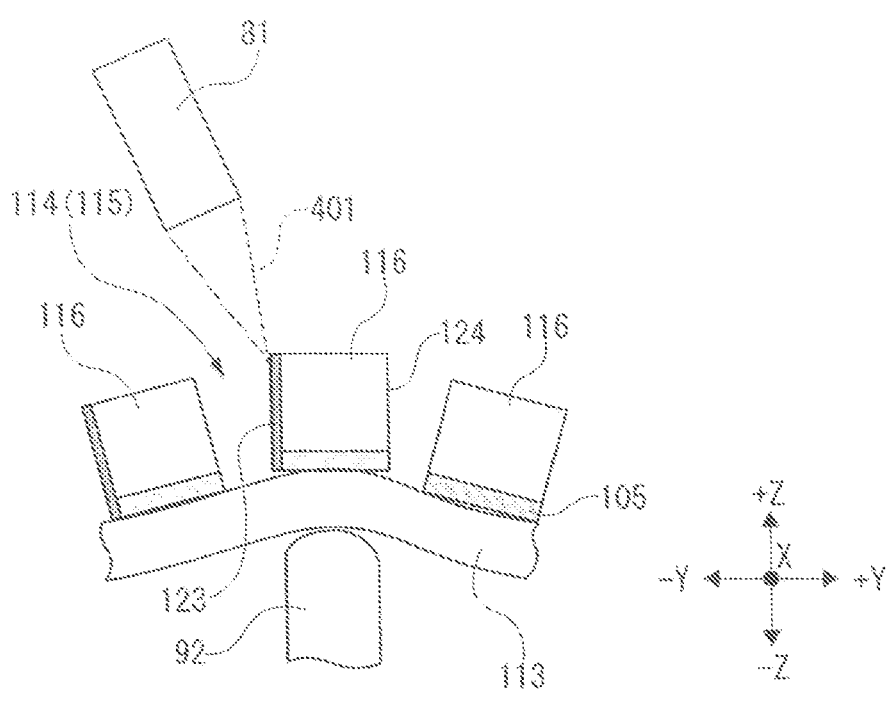
FIG. 12 is a sectional view illustrating another example of a first energy supply step.

In this state, the controller 7 controls the holding mechanism 90 to position the pushing-up component 92 below the chips 116 on the one row to be irradiated with the laser beam 401 (chips 116 of the supply target of energy) and push up the chips 116 relatively compared with the other chips 116 by the pushing-up component 92 and expose side surfaces of them. That is, as illustrated in FIG. 12, the controller 7 exposes first side surfaces 123 that are each one of two side surfaces parallel to the X-axis direction in the four side surfaces of each of the chips 116 to be irradiated with the laser beam 401 in such a manner that the first side surface 123 is opposed to the processing head 81 (side surface exposure step).

In this state, the controller 7 executes irradiation with the laser beam 401 from the processing head 81 and moves the holding part 55 in the X-axis direction by the X-axis movement mechanism 70 (see FIG. 4). Thereby, the exposed first side surfaces 123 in the pushed-up chips 116 on the one row are sequentially irradiated with the laser beam 401 from the processing head 81 and are supplied with energy. It is preferable for the controller 7 to adjust the tilt of the laser beam 401 as appropriate to cause the whole of the first side surfaces 123 to be irradiated with the laser beam 401.

Thereafter, the controller 7 changes the row of the chips 116 to be irradiated with the laser beam 401 by the Y-axis movement mechanism 60 (see FIG. 4). In addition, the controller 7 controls the movement mechanism 93 to push up the chips 116 by the pushing-up component 92 and irradiates the first side surfaces 123 thereof with the laser beam 401. In this manner, the controller 7 irradiates the first side surfaces 123 of all chips 116 in the wafer 100 with the laser beam 401.

Figure 13:
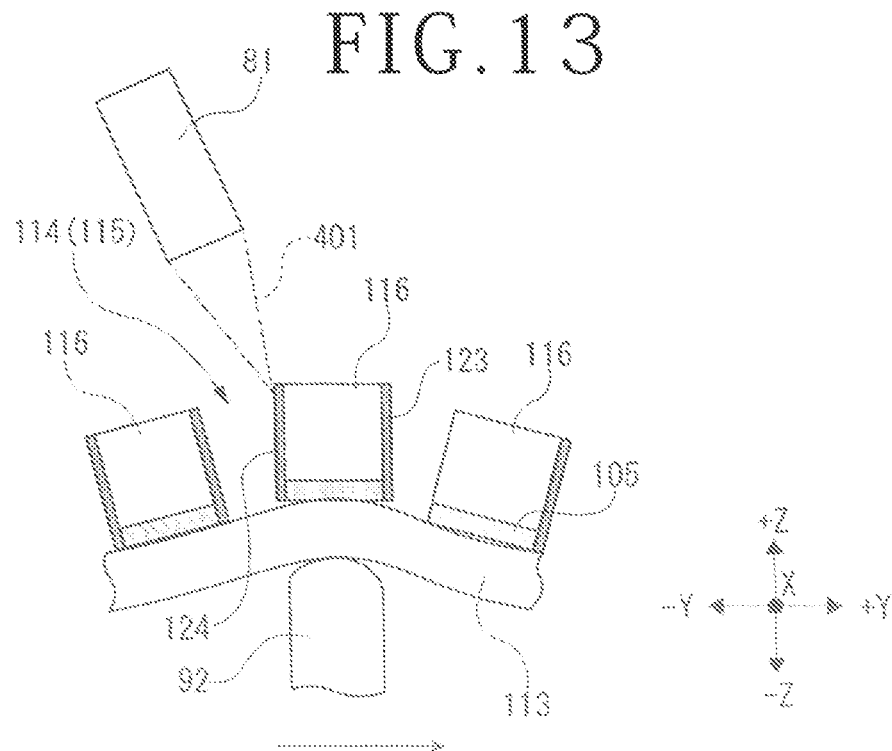
FIG. 13 is a sectional view illustrating the other example of the first energy supply step.

Next, the controller 7 rotates an orientation of the frame unit 110 of the wafer 100 by 180 degrees by the θ table 59 (see FIG. 10) and irradiates second side surfaces 124 opposed to the first side surfaces 123 in the chips 116 with the laser beam 401 as illustrated in FIG. 13.

In this manner, the controller 7 irradiates the four side surfaces of all chips 116 in the wafer 100 with the laser beam 401 while changing the orientation of the frame unit 110 by the θ table 59. This can melt all side surfaces of the chips 116 and repair at least part of processing strain therein.

Also, in the second energy supply step of the first dividing method illustrated in FIG. 7A, the side surfaces of the chips 116 may be irradiated with the laser beam 401 as described above.

Furthermore, as described above, the laser beam irradiation mechanism 80 of the laser processing apparatus 4 outputs the laser beam with a wavelength having absorbability with respect to the wafer 100. For example, when the wafer 100 is a silicon wafer, the wavelength of the laser beam output from the laser beam irradiation mechanism 80 is a wavelength in a range of 500 to 1000 nm, which is a wavelength having absorbability with respect to silicon.

FIG. 14 is a diagram illustrating a table indicating a relation between the wavelength of the laser beam output from the laser beam irradiation mechanism 80 and a result (processing result) of the first energy supply step and the second energy supply step executed by using the respective laser beams. As illustrated in this table, when the wavelength was a wavelength in a range of 500 to 1000 nm, it was possible to favorably melt the laser-irradiated parts in the wafer 100 that was the silicon wafer.

On the other hand, when the wavelength was equal to or shorter than 355 nm, it was difficult to sufficiently melt the laser-irradiated parts in the wafer 100 that was the silicon wafer. Moreover, also when the wavelength was 1064 nm, it was difficult to favorably melt the laser-irradiated parts because the laser beam was transmitted through the wafer 100.

In the above-described embodiments, it is preferable that a material of the wafer 100 as a workpiece be a material that grows in a liquid phase, such as Si, Ge, and GaAs. The material that grows in a liquid phase readily melts through irradiation with a laser beam. Thus, processing strain of the wafer 100 can be favorably repaired by irradiation with a laser beam.

In the first energy supply step and the second energy supply step, it suffices that at least part of processing strain caused in the chips 116 can be repaired through supply of energy to at least part of the chips 116 to keep an adverse effect from being caused on the devices formed in the wafer 100. Therefore, the energy may be supplied in any form in the first energy supply step and the second energy supply step. For example, processing strain may be repaired by executing irradiation with plasma, an ion beam, or the like instead of irradiation with a laser beam.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A dividing method of a wafer by which the wafer having device regions marked out by a plurality of planned dividing lines that intersect in a front surface is divided along the planned dividing lines, the dividing method comprising:

a back surface grinding step of grinding a back surface of the wafer;

a dividing step of dividing the wafer from the front surface along the planned dividing lines to form a plurality of chips; and a first energy supply step of supplying energy to at least any part of edges, back surfaces, and side surfaces of the chips from the back surface of the wafer and melting the at least any part to repair at least part of processing strain.

2. The dividing method of the wafer according to claim 1, wherein the first energy supply step includes a side surface exposure step of pushing up chips of a supply target of the energy relatively compared with other chips and exposing side surfaces of the chips of the supply target of the energy, and the energy is supplied to the side surfaces exposed in the side surface exposure step.

3. The dividing method of the wafer according to claim 1, wherein the first energy supply step is a step of executing irradiation with a laser beam.

4. The dividing method of the wafer according to claim 3, wherein a wavelength of the laser beam is a wavelength having absorbability with respect to the wafer.

5. The dividing method of the wafer according to claim 3, wherein a wavelength of the laser beam is a wavelength in a range of 500 to 1000 nm.

6. The dividing method of the wafer according to claim 1, further comprising:

a second energy supply step of supplying energy to at least any part of the edges, the back surfaces, and the side surfaces of the chips from the front surface of the wafer and melting the at least any part.

7. A dividing method of a wafer by which the wafer having device regions marked out by a plurality of planned dividing lines that intersect in a front surface is divided along the planned dividing lines, the dividing method comprising:

a processing groove forming step of forming processing grooves deeper than a finished thickness in the wafer from the front surface;

a back surface grinding step of grinding the wafer to the finished thickness from a back surface of the wafer to divide the wafer and form a plurality of chips after execution of the processing groove forming step; and a first energy supply step of supplying energy to at least any part of edges, back surfaces, and side surfaces of the chips from the back surface of the wafer and melting the at least any part to repair at least part of processing strain.

* * * * *